(12) United States Patent
Dorf et al.

(10) Patent No.: US 9,443,700 B2
(45) Date of Patent: Sep. 13, 2016

(54) ELECTRON BEAM PLASMA SOURCE WITH SEGMENTED SUPPRESSION ELECTRODE FOR UNIFORM PLASMA GENERATION

(71) Applicant: APPLIED MATERIALS, INC., Santa Clara, CA (US)

(72) Inventors: Leonid Dorf, San Jose, CA (US); Shahid Rauf, Pleasanton, CA (US); Kenneth S. Collins, San Jose, CA (US); Nipun Misra, San Jose, CA (US); Kartik Ramaswamy, San Jose, CA (US); James D. Carducci, Sunnyvale, CA (US); Steven Lane, Porterville, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 212 days.

(21) Appl. No.: 14/176,365

(22) Filed: Feb. 10, 2014

(65) Prior Publication Data
US 2014/0265855 A1 Sep. 18, 2014

Related U.S. Application Data

(60) Provisional application No. 61/777,197, filed on Mar. 12, 2013.

(51) Int. Cl.
*H01J 37/32* (2006.01)
(52) U.S. Cl.
CPC .................................. *H01J 37/3233* (2013.01)
(58) Field of Classification Search
None
See application file for complete search history.

(56) References Cited

U.S. PATENT DOCUMENTS

| 3,125,492 A | 3/1964 | Baker |
| 3,755,073 A | 8/1973 | Haught et al. |
| 4,987,346 A | 1/1991 | Katzschner et al. |
| 5,217,761 A | 6/1993 | Okada et al. |
| 5,273,609 A * | 12/1993 | Moslehi .................. C23C 15/52 118/722 |
| 5,368,676 A | 11/1994 | Nagaseki et al. |
| 5,369,953 A | 12/1994 | Brophy |
| 5,539,274 A | 7/1996 | Araki et al. |
| 5,639,308 A | 6/1997 | Yamazaki et al. |
| 5,874,807 A | 2/1999 | Neger et al. |
| 6,116,187 A | 9/2000 | Murakami et al. |
| 6,211,622 B1 | 4/2001 | Ryoji et al. |
| 6,348,158 B1 * | 2/2002 | Samukawa ....... H01J 37/32422 216/61 |
| 6,356,026 B1 | 3/2002 | Murto |

(Continued)

FOREIGN PATENT DOCUMENTS

| JP | 08-222553 A | 8/1996 |
| JP | 2001-085414 A | 3/2001 |

(Continued)

OTHER PUBLICATIONS

Official Action Dated Nov. 13, 2015 Issued in Related U.S. Appl. No. 13/595,655.

(Continued)

*Primary Examiner* — Douglas W Owens
*Assistant Examiner* — Srinivas Sathiraju
(74) *Attorney, Agent, or Firm* — Robert M. Wallace

(57) ABSTRACT

A plasma reactor that generates plasma in a workpiece processing chamber by an electron beam, has an electron beam source and segmented suppression electrode with individually biased segments to control electron beam density distribution.

14 Claims, 7 Drawing Sheets

(56) References Cited

U.S. PATENT DOCUMENTS

| | | | |
|---|---|---|---|
| 6,368,678 B1* | 4/2002 | Bluck | C23C 16/26 118/723 E |
| 6,452,338 B1 | 9/2002 | Horsky | |
| 7,005,660 B2* | 2/2006 | Honda | H01J 37/317 250/492.3 |
| 7,023,002 B2* | 4/2006 | Nagaseki | H01L 21/67115 250/492.1 |
| 7,183,716 B2 | 2/2007 | Kanarov et al. | |
| 7,470,329 B2 | 12/2008 | Oehrlein et al. | |
| 7,479,643 B2* | 1/2009 | Horsky | C23C 14/48 250/423 R |
| 7,547,899 B2 | 6/2009 | Vanderpot et al. | |
| 7,629,590 B2* | 12/2009 | Horsky | C23C 14/48 250/423 R |
| 7,734,014 B2 | 6/2010 | Bergmann et al. | |
| 7,820,981 B2* | 10/2010 | Horsky | C23C 14/48 250/423 R |
| 7,909,961 B2 | 3/2011 | Kumar et al. | |
| 8,368,309 B2* | 2/2013 | Horsky | C23C 14/48 250/423 R |
| 2002/0004309 A1 | 1/2002 | Collins et al. | |
| 2002/0078893 A1 | 6/2002 | Os et al. | |
| 2002/0168049 A1 | 11/2002 | Schriever et al. | |
| 2004/0104353 A1 | 6/2004 | Berglund | |
| 2005/0011447 A1* | 1/2005 | Fink | C23C 16/45565 118/715 |
| 2006/0208649 A1* | 9/2006 | Rueger | H01J 37/32366 315/111.21 |
| 2007/0017636 A1* | 1/2007 | Goto | B82Y 30/00 156/345.47 |
| 2007/0023674 A1 | 2/2007 | Umisedo et al. | |
| 2007/0040130 A1 | 2/2007 | Nanataki et al. | |
| 2007/0170414 A1 | 7/2007 | Takai et al. | |
| 2007/0194245 A1 | 8/2007 | Yevtukhov et al. | |
| 2007/0278417 A1 | 12/2007 | Horsky et al. | |
| 2008/0156771 A1 | 7/2008 | Jeon et al. | |
| 2008/0178805 A1 | 7/2008 | Paterson et al. | |
| 2008/0179284 A1 | 7/2008 | Hayes et al. | |
| 2008/0179535 A1 | 7/2008 | Dang et al. | |
| 2008/0181365 A1 | 7/2008 | Matoba | |
| 2008/0182418 A1 | 7/2008 | Collins et al. | |
| 2009/0140176 A1 | 6/2009 | Hershkowitz et al. | |
| 2009/0149028 A1 | 6/2009 | Marakhtanov et al. | |
| 2009/0159811 A1 | 6/2009 | Klemm et al. | |
| 2010/0032587 A1 | 2/2010 | Hosch et al. | |
| 2011/0024047 A1 | 2/2011 | Nguyen et al. | |
| 2011/0212624 A1 | 9/2011 | Hudson | |
| 2012/0211166 A1 | 8/2012 | Yevtukhov et al. | |
| 2012/0258601 A1 | 10/2012 | Holland et al. | |
| 2012/0258606 A1 | 10/2012 | Holland et al. | |
| 2012/0258607 A1 | 10/2012 | Holland et al. | |
| 2013/0098551 A1* | 4/2013 | Dorf | H01H 37/3233 156/345.4 |
| 2013/0098552 A1* | 4/2013 | Dorf | H01J 37/3233 156/345.4 |
| 2013/0098553 A1* | 4/2013 | Bera | H01J 37/3233 156/345.4 |
| 2013/0098555 A1 | 4/2013 | Bera et al. | |
| 2013/0098872 A1* | 4/2013 | Dorf | H01J 37/3233 216/67 |
| 2013/0098873 A1 | 4/2013 | Ramaswamy et al. | |
| 2013/0098882 A1* | 4/2013 | Dorf | H05H 1/46 219/121.21 |
| 2013/0098883 A1 | 4/2013 | Bera et al. | |
| 2014/0035458 A1* | 2/2014 | Wu | H01J 37/3233 315/5.35 |
| 2014/0265855 A1* | 9/2014 | Dorf | H01J 37/3233 315/111.31 |
| 2014/0338835 A1* | 11/2014 | Dorf | H04H 1/50 156/345.33 |
| 2014/0339980 A1* | 11/2014 | Wu | H01J 37/32669 315/5.13 |
| 2015/0093862 A1* | 4/2015 | Nainani | H01L 21/02063 438/197 |

FOREIGN PATENT DOCUMENTS

| | | |
|---|---|---|
| KR | 10-2005-0008065 A | 1/2005 |
| KR | 10-2007-0041220 A | 4/2007 |
| KR | 10-2009-0008932 A | 1/2009 |
| KR | 10-2010-0042610 A | 4/2010 |
| WO | WO 2011/024174 A1 | 3/2011 |

OTHER PUBLICATIONS

Official Action Issued Jul. 31, 2014 in Corresponding U.S. Appl. No. 13/595,292.

Official Action Issued Aug. 6, 2014 in Corresponding U.S. Appl. No. 13/595,452.

Furman, M.A., et al. "Stimulation of Secondary Electron Emission Based Upon a Phenomenological . . .", LBNL-52807/SLAC-PUB-9912, Jun. 2, 2003, pp. 1-31, Lawrence Berkley Natl. Lab.

Official Action Dated Oct. 23, 2015 Issued in Related U.S. Appl. No. 13/595,134.

Official Action Dated Apr. 22, 2015 Issued in Related U.S. Appl. No. 13/595,201.

Official Action Dated Nov. 25, 2014 Issued in Related U.S. Appl. No. 13/595,612.

Official Action Dated Dec. 24, 2014 Issued in Related U.S. Appl. No. 13/595,292.

Official Action Dated Dec. 30, 2015 Issued in Related U.S. Appl. No. 13/595,351.

Official Action Dated Dec. 21, 2015 Issued in Related U.S. Appl. No. 13/595,252.

* cited by examiner

“ELECTRON BEAM PLASMA SOURCE WITH SEGMENTED SUPPRESSION ELECTRODE FOR UNIFORM PLASMA GENERATION

CROSS-REFERENCE TO RELATED APPLICATIONS

This application claims the benefit of U.S. Provisional Application Ser. No. 61/777,197 filed Mar. 12, 2013 entitled ELECTRON BEAM PLASMA SOURCE WITH SEGMENTED SUPPRESSION ELECTRODE FOR UNIFORM PLASMA GENERATION, by Leonid Dorf, et al.

BACKGROUND

A plasma reactor for processing a workpiece can employ an electron beam to generate plasma in a processing chamber. The electron beam source produces a high-energy, sheet electron beam, which is injected into the processing chamber. As the electron beam propagates through the processing chamber, it produces plasma for etching or other applications. Such a plasma reactor can exhibit non-uniform distribution of processing results (e.g., distribution of etch rate across the surface of a workpiece) due to non-uniform distribution of electron density and/or kinetic energy within the electron beam. Such non-uniformities can be distributed in a direction transverse to the beam propagation direction.

SUMMARY

A plasma reactor for processing a workpiece includes a workpiece processing chamber having a beam entrance, and an electron beam source chamber comprising an electron beam source enclosure having a beam opening facing the beam entrance of the workpiece processing chamber. An extraction electrode is provided between the beam opening and the beam entrance, and an acceleration electrode is provided between the extraction electrode and the beam entrance. A suppression electrode is provided between the extraction electrode and the acceleration electrode, the suppression electrode comprising plural segments insulated from one another, and respective bias sources coupled to respective ones of the plural segments. In one embodiment, the respective bias sources comprise individually controlled voltage sources connected to respective ones of the plural segments. In another embodiment, the respective bias sources comprise a set of individually controlled electrical elements connected between individual ones of the segments and a common voltage source. A controller sets the individually controlled voltage sources. In one embodiment, the individually controlled electrical elements comprise plural switches.

BRIEF DESCRIPTION OF THE DRAWINGS

So that the manner in which the exemplary embodiments of the present invention are attained can be understood in detail, a more particular description of the invention summarized above is given by reference to the embodiments thereof which are illustrated in the appended drawings. It is to be appreciated that certain well known processes are not discussed herein in order to not obscure the invention.

Figure 1A:
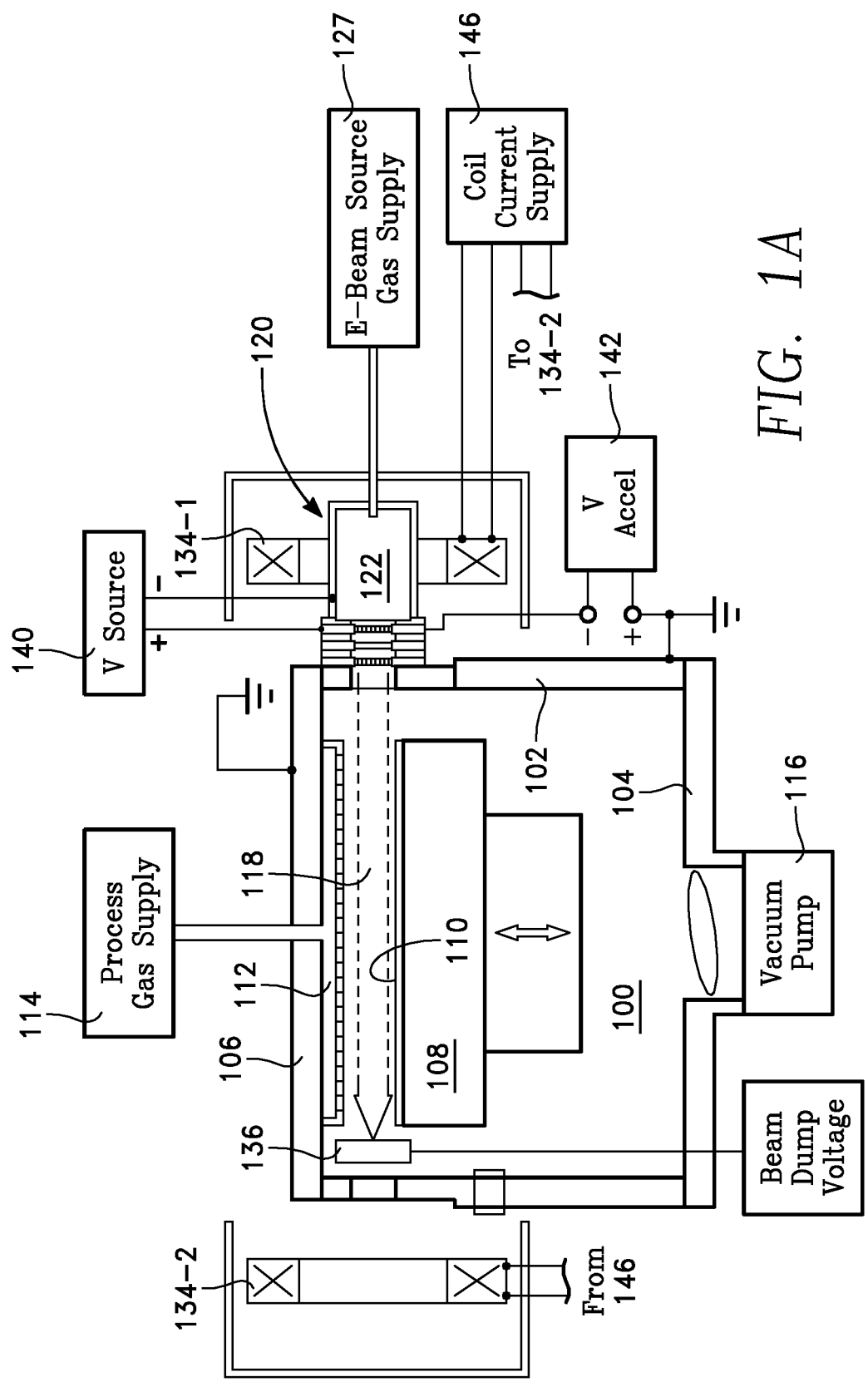
FIG. 1A is a side view of a plasma reactor having an electron beam as a plasma source, and having a beam suppression electrode consisting of independently biased segments.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Figure 1B:
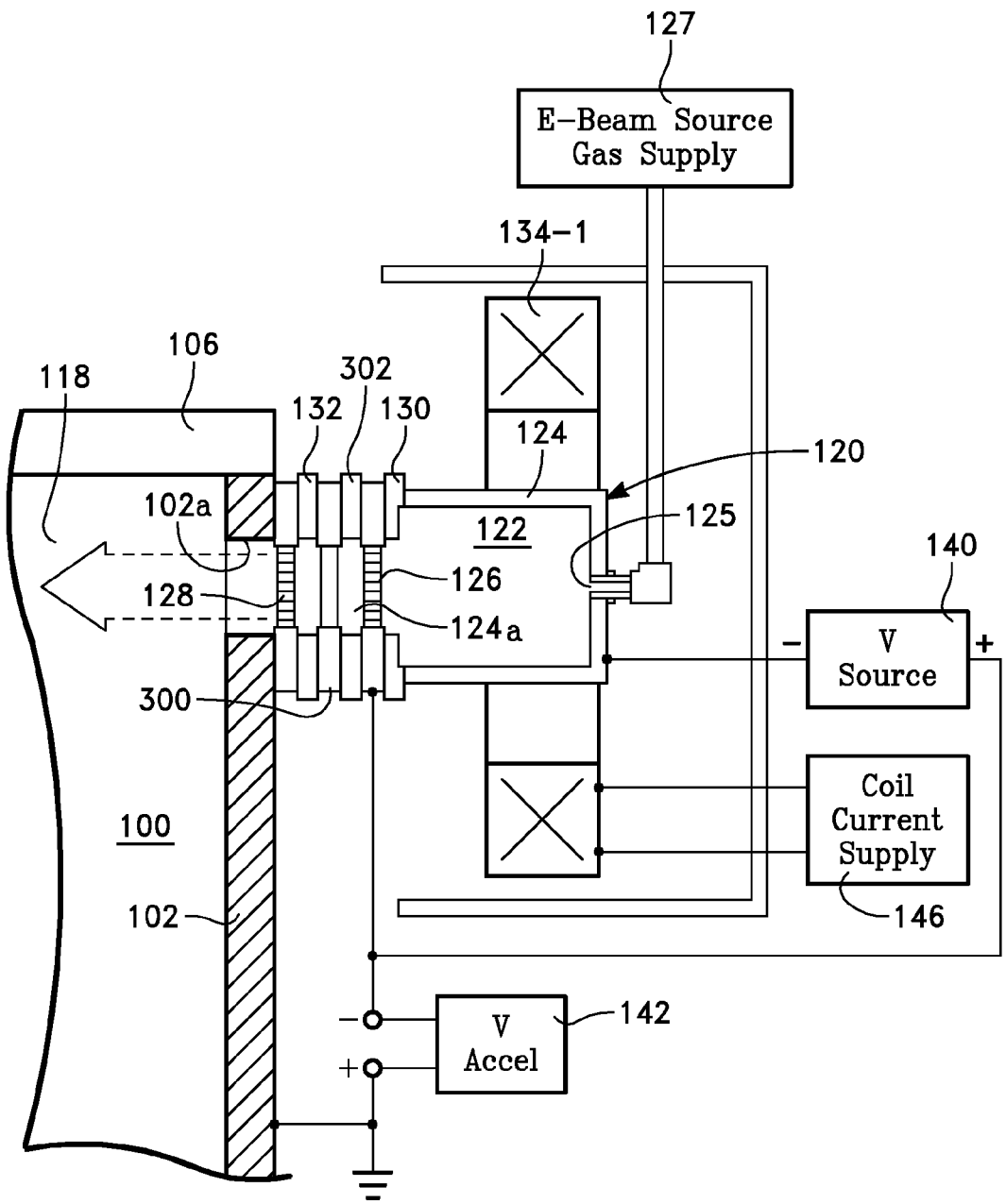
FIG. 1B is an enlarged view of a portion of FIG. 1A.
Figure 1C:
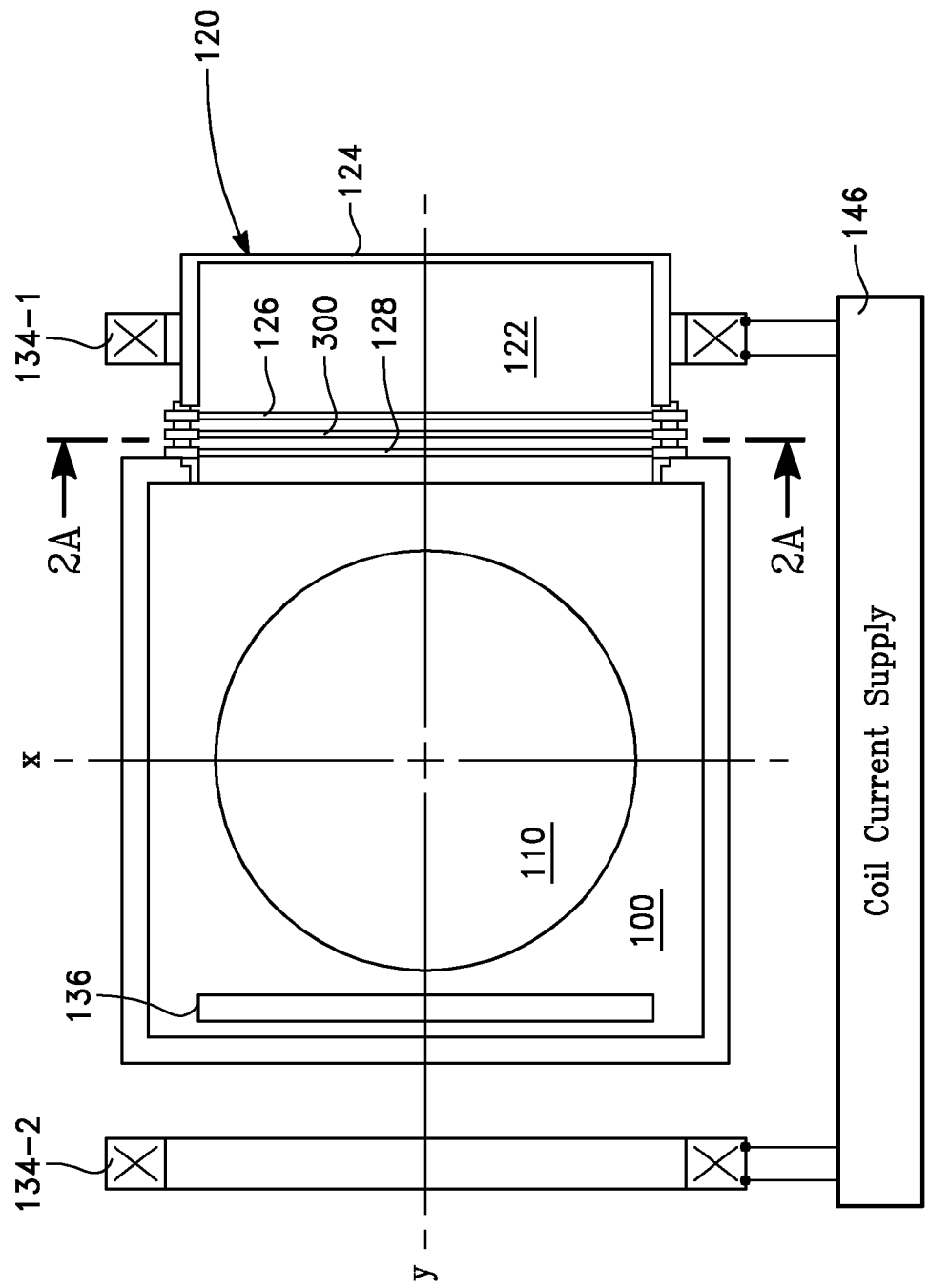
FIG. 1C is a top view of the plasma reactor of FIG. 1A.

Referring to FIGS. 1A-1C, a plasma reactor has an electron beam as a plasma source. The reactor includes a process chamber 100 enclosed by a cylindrical sidewall 102, a floor 104 and a ceiling 106. A workpiece support pedestal 108 supports a workpiece 110, such as a semiconductor wafer, the pedestal 108 being movable in the axial (e.g., vertical) direction. A gas distribution plate 112 is integrated with or mounted on the ceiling 106, and receives process gas from a process gas supply 114. A vacuum pump 116 evacuates the chamber through the floor 104. A process region 118 is defined between the workpiece 110 and the gas distribution plate 112. Within the process region 118, the process gas is ionized to produce a plasma for processing of the workpiece 110.

The plasma is generated in the process region 118 by an electron beam from an electron beam source 120. The electron beam source 120 includes a electron beam source chamber 122 outside of the process chamber 100 and having a conductive enclosure 124. The conductive enclosure 124 has a gas inlet or neck 125. An electron beam source gas supply 127 is coupled to the gas inlet 125. The conductive enclosure 124 has an opening 124a facing the process region 118 through an opening 102a in the sidewall 102 of the process chamber 100.

The electron beam source 120 includes an extraction grid or electrode 126 between the opening 124a and the electron beam source chamber 122, and an acceleration grid or electrode 128 between the extraction grid 126 and the process region 118, best seen in the enlarged view of FIG. 1B. The extraction grid 126 and the acceleration grid 128 may be formed as separate conductive meshes, for example. The extraction grid 126 and the acceleration grid 128 are mounted with insulators 130, 132, respectively, so as to be electrically insulated from one another and from the conductive enclosure 124. However, the acceleration grid 128 is in electrical contact with the sidewall 102 of the chamber 100. The openings 124a and 102a and the extraction and acceleration grids 126, 128 are mutually congruent, generally, and define a thin wide flow path for an electron beam into the processing region 118. The width of the flow path is about the diameter of the workpiece 110 (e.g., 100-500 mm) while the height of the flow path is less than about 1 inch.

The electron beam source 120 further includes a pair of electromagnets 134-1 and 134-2 adjacent opposite sides of the chamber 100, the electromagnet 134-1 surrounding the electron beam source 120. The two electromagnets 134-1 and 134-2 produce a magnetic field parallel to the electron beam path. The electron beam flows across the processing region 118 over the workpiece 110, and is absorbed on the opposite side of the processing region 118 by a beam dump 136. The beam dump 136 is a conductive body having a shape adapted to capture the wide thin electron beam.

A negative terminal of a plasma D.C. discharge voltage supply 140 is coupled to the conductive enclosure 124, and a positive terminal of the voltage supply 140 is coupled to the extraction grid 126. In turn, a negative terminal of an acceleration voltage supply 142 is connected to the extraction grid 126, and a positive terminal of the acceleration voltage supply 142 is connected to the grounded sidewall 102 of the process chamber 100. A coil current supply 146 is coupled to the electromagnets 134-1 and 134-2. Plasma is generated within the chamber 122 of the electron beam source 120 by a D.C. gas discharge produced by power from the voltage supply 140. This D.C. gas discharge is the main plasma source of the electron beam source 120. Electrons are extracted from the plasma in the chamber 122 through the extraction grid 126 and the acceleration grid 128 to produce an electron beam that flows into the processing chamber 100. Electrons are accelerated to energies equal to the voltage provided by the acceleration voltage supply 142.

The electron beam source 120 in the embodiment of FIG. 1B has been described as a D.C. gas discharge plasma source. In other embodiments, the electron beam source 120 may embody any other suitable plasma source, such as a capacitively coupled plasma source, an inductively coupled plasma source or a toroidal plasma source.

The distribution of electron density across the width of the beam (along the X-axis of FIG. 1C) is liable to exhibit non-uniformities. Such non-uniformities may arise within the electron beam source chamber 122, for example, or may arise from causes external of the electron beam source chamber 122. These non-uniformities affect plasma ion density distribution in the process region 118 and can lead to non-uniform processing of a workpiece in the processing chamber 100.

Figure 2A:
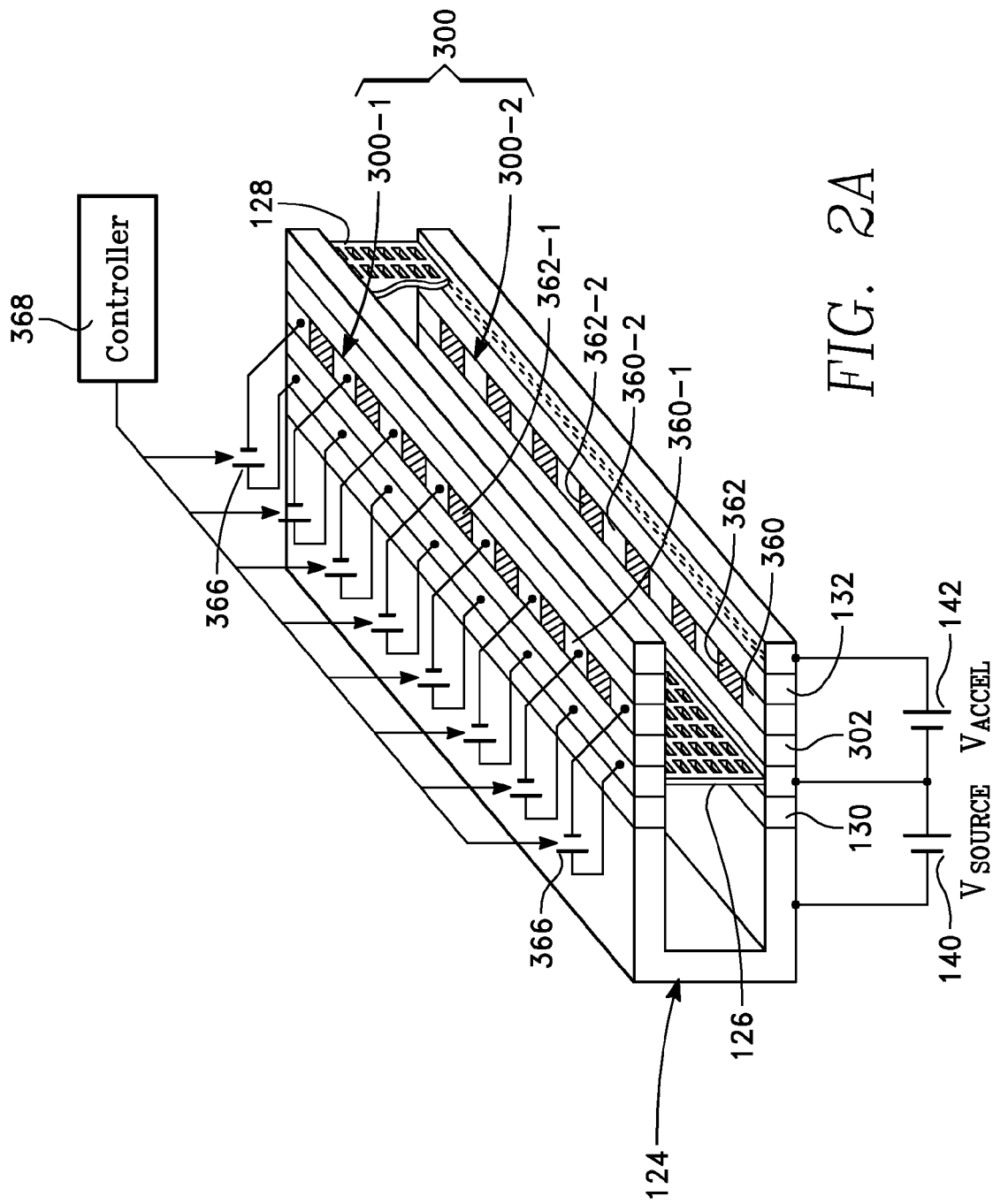
FIG. 2A is an orthographic projection corresponding to FIG. 1B in accordance with an embodiment employing independent bias voltage sources for the suppression electrode segments.
Figure 2B:
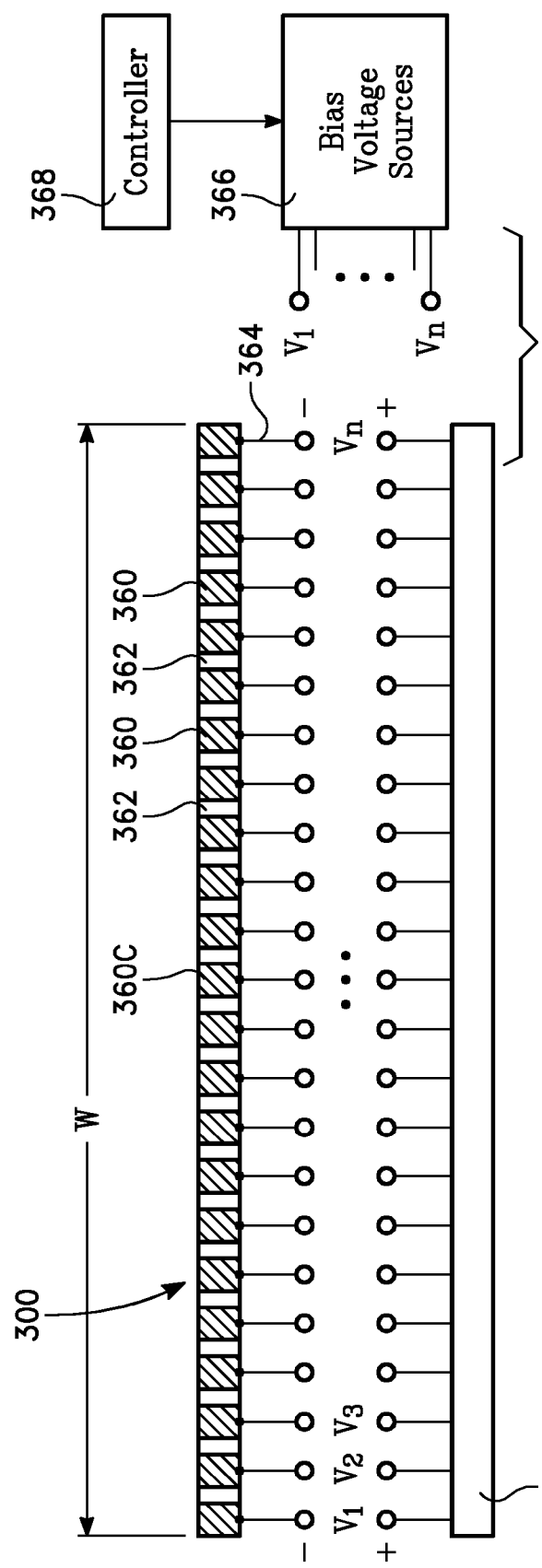
FIG. 2B is a front cross-sectional view of the multi-segment suppression electrode taken along lines 2A-2A of FIG. 1C in accordance with the embodiment of FIG. 2A employing independent bias voltage sources for the suppression electrode segments.

In order to counteract such non-uniformities, a suppression electrode 300 is provided between the extraction grid 126 and the acceleration grid 128, as depicted in FIGS. 1B and 1C. An embodiment of the suppression electrode 300 is depicted in FIGS. 2A and 2B. In the illustrated embodiment, the suppression electrode 300 is divided into an upper section 300-1 and a lower section 300-2, defining a slot between the upper and lower sections 300-1, 300-2. In this specification, the upper and lower sections 300-1, 300-2 are referred to collectively as the suppression electrode 300. An insulator 302 separates the suppression electrode 300 from the extraction grid 126. The insulator 132 previously referred to herein separates the suppression electrode 300 from the acceleration grid 128, as shown in FIG. 1B. The multi-segment suppression electrode 300 consists of plural parallel electrode segments 360 (or suppression electrode segments) distributed along the X-axis. In the illustrated embodiment, each of the segments 360 is divided into upper and lower segment sections 360-1, 360-2 in registration with the upper and lower sections 300-1, 300-2 of the suppression electrode 300. The each pair of upper and lower segment sections 360-1, 360-2 are electrically coupled to one another, but separated from the other pairs of upper and lower segment sections. Each pair of upper and lower segment sections 360-1, 360-2 is herein referred to collectively a segment 360. The segments 360 are insulated from one another by respective insulators 362, which may be ceramic insulators, each consisting of an upper and a lower insulator section 362-1, 362-2, respectively, in registration with the upper and lower segment sections 360-1, 360-2, respectively. Each segment 360 is biased independently. In one embodiment, the each segment 360 may be biased negatively with respect to the extraction grid 126. Negatively biasing a particular segment 360 (such as the segment 360c of FIG. 2B for example) with respect to the extraction grid 126 prevents electrons in the region of the particular segment 360c from exiting through the suppression electrode 300 or being accelerated through the acceleration grid 128. The negatively biased segment 360c thus suppresses electron beam current in the adjacent region. By individually adjusting the bias on the individual suppression electrode segments 360, the distribution of the electron beam current density along the X-axis may be controlled.

In the embodiment of FIGS. 2A and 2B, the bias voltages on the different segments 360 are furnished by an array of bias voltage sources 366. A controller 368 controls the different bias voltages furnished by the different bias voltage sources 366. In one embodiment, the bias voltage on each segment 360 is controlled independently of the other segments. As will be described later herein, in a related embodiment the bias voltage sources 366 may produce pulsed voltages, and the controller 368 adjusts the distribution of pulse duty cycles of the different bias voltage sources 366 to achieve the desired change in electron density distribution of the electron beam.

Each segment 360 may have an individual voltage terminal 364, and different negative voltages may be applied to different ones of the segments 360 simultaneously. In one embodiment, the voltage sources 366 provide individually selected voltages $V_1, V_2, V_3, \ldots V_n$ to the respective terminals 364, where n is an integer and is the number of suppression electrode segments 360. The controller 368 controls the individual voltages $V_1, V_2, V_3, \ldots V_n$.

The voltages $V_1, V_2, V_3, \ldots V_n$ applied to the suppression electrode segments 360 may be non-uniformly distributed along the X-axis, or "profiled", so as to affect the density distribution of electrons across the width of the beam dump 136 (along the X-axis). The profile or distribution of the voltages $V_1, V_2, V_3, \ldots V_n$ is selected to counteract a non-uniformity of this density distribution along the X-axis. Such non-uniformity may be determined from conventional measurements of workpieces or wafers previously processed in the chamber 100. Such measurements may be those of etch depth distribution across the workpiece surface in one embodiment.

In one embodiment, each of the voltage sources 366 applies a pulsed voltage to the corresponding suppression electrode segment 360, and the pulse duty cycles of the voltages applied to the different segments are individually adjusted by the controller 368. Adjustment of the pulse duty cycles of the different suppression electrode segments 360 changes electron density distribution in the electron beam along the X-axis. Such adjustment may be performed to produce a desired X-axis distribution of plasma ion density in the process region 118.

Figure 3A:
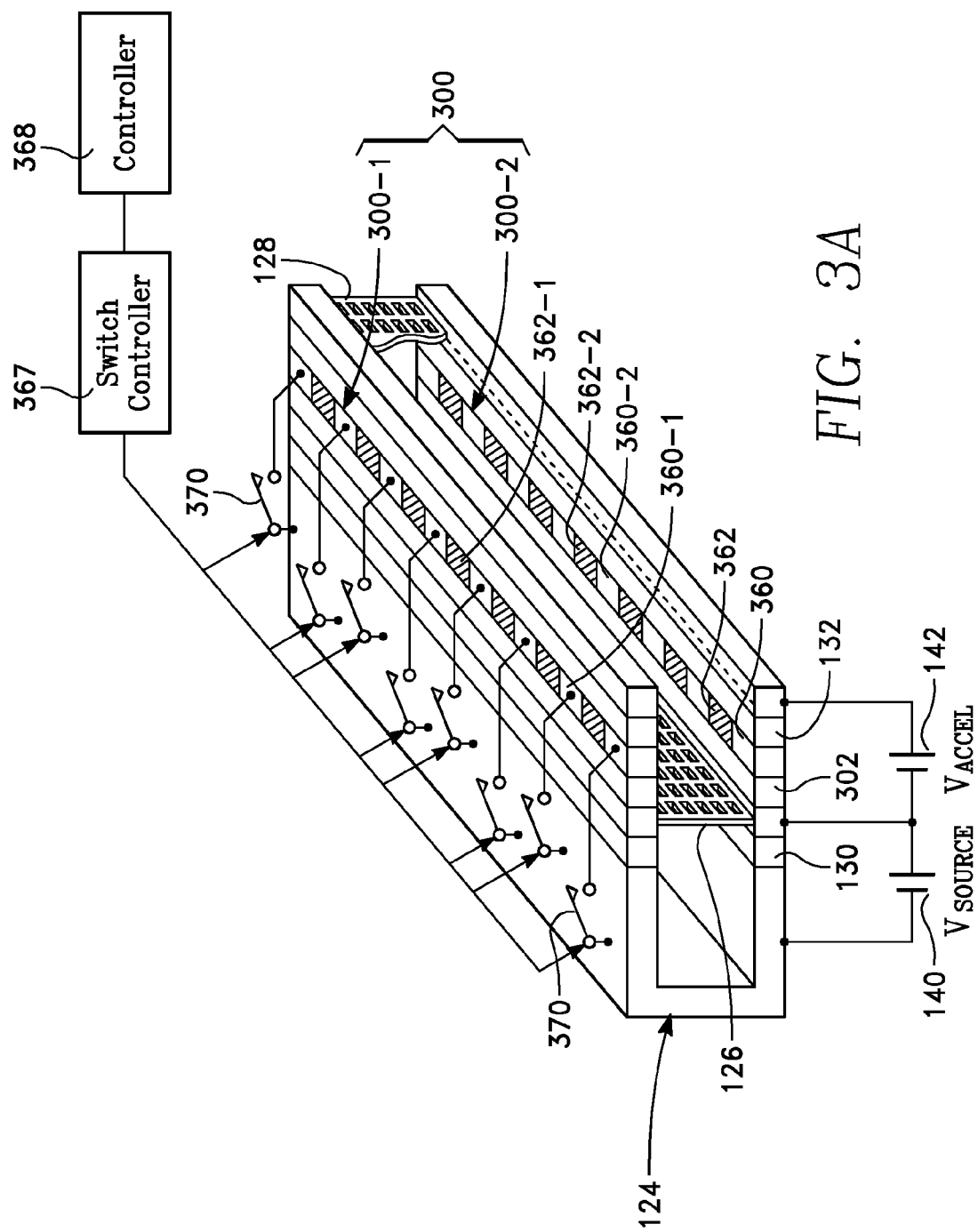
FIG. 3A is an orthographic projection corresponding to FIG. 1B in accordance with an embodiment employing independent electrical elements, such as switches, connected to the suppression electrode segments.
Figure 3B:
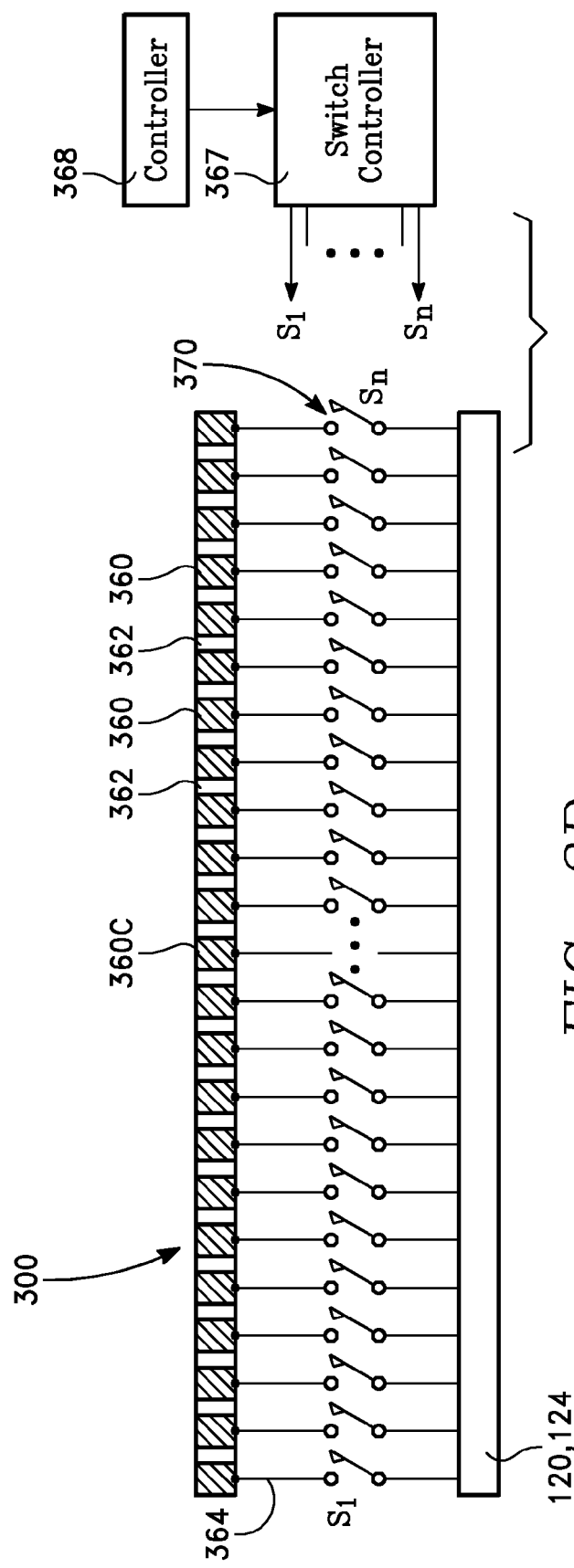
FIG. 3B is a front cross-sectional view of the multi-segment suppression electrode taken along lines 2A-2A of FIG. 1C in accordance with the embodiment of FIG. 3A.

FIGS. 3A and 3B depicts an embodiment in which electrical profiling of the voltages applied to the suppression electrode segments 360 is performed using an array 370 of electrically configurable elements. In FIGS. 3A and 3B, the electrically configurable elements are switches $S_1$, $S_2$, $S_3$, ... $S_n$, connected between the respective terminals 364 and a common voltage potential source, such as the conductive enclosure 124 of FIG. 1B, for example. A switch controller 367 governs the opening and closing of each switch $S_1$, $S_2$, $S_3$, ... $S_n$ individually.

The electron beam density distribution along the X-axis is dynamically adjustable by adjusting the magnitudes or the pulse duty cycles of the individual voltages $V_1$, $V_2$, $V_3$, ... $V_n$ in the embodiment of FIG. 2A, or by adjusting the switching duty cycles of the individual switches $S_1$, $S_2$, $S_3$, ... $S_n$ in the embodiment of FIG. 3A. For example, the adjustments referred to above with reference to FIGS. 2A and 3A may be performed to counteract a non-uniformity in density distribution along the X-axis. In one example, such non-uniformity may be determined by conventional measurements of workpieces previously processed in the chamber 100. Such measurements may be of etch depth distribution across the workpiece surface, for example.

The negatively biased suppression electrode 300 attracts ions from the e-beam source plasma, which may cause sputtering of the suppression electrode 300. However, the negative voltage on each segment 360 of the suppression electrode 300 may be relatively low, thereby reducing the likelihood of sputtering. For example, a negative voltage as little as 50-100 vdc may be sufficient to block electrons in the region of an individual segment 360 from exiting the source plasma discharge (through the extraction grid), in which the electron temperature is on the order of a few electron volts. A related advantage is that extracted ions do not reach the processing chamber 100. This is because the extracted ions are stopped by the potential difference between each segment 360 of the suppression electrode 300 and the acceleration grid 128.

While the main plasma source in the electron beam source 120 is a D.C. gas discharge produced by the voltage supply 140, any other suitable plasma source may be employed instead as the main plasma source. For example, the main plasma source of the electron beam source 120 may be a toroidal RF plasma source, a capacitively coupled RF plasma source, or an inductively coupled RF plasma source.

While the foregoing is directed to embodiments of the present invention, other and further embodiments of the invention may be devised without departing from the basic scope thereof, and the scope thereof is determined by the claims that follow.

What is claimed is:

1. A plasma reactor for processing a workpiece, comprising:
    a workpiece processing chamber;
    an electron beam source chamber comprising an electron beam source enclosure having a beam opening communicating with said workpiece processing chamber;
    an extraction electrode between said beam opening and said workpiece processing chamber and an acceleration electrode between said extraction electrode and said workpiece processing chamber and insulated from said extraction electrode;
    a suppression electrode between said extraction electrode and said acceleration electrode, said suppression electrode comprising plural segments insulated from one another, and respective bias sources coupled to respective ones of said plural segments, wherein said respective bias sources comprise a set of individually controlled electrical elements and a suppression voltage source, said individually controlled electrical elements connected between respective ones of said segments and said suppression voltage source.

2. The plasma reactor of claim 1 wherein said respective bias sources comprise individually controlled voltage sources connected to respective ones of said plural segments.

3. The plasma reactor of claim 2 further comprising:
    a controller coupled to said individually controlled voltage sources.

4. The plasma reactor of claim 3 wherein said controller is adapted to control at least one of: (a) voltage magnitudes of said individually controlled voltage sources, (b) pulse duty cycles of said individually controlled voltage sources.

5. The plasma reactor of claim 1 wherein said individually controlled electrical elements comprise plural switches.

6. The plasma reactor of claim 1 further comprising: a controller for controlling said individually controlled electrical elements.

7. The plasma reactor of claim 6 wherein said controller is adapted to govern respective switching duty cycles of said individually controlled electrical elements.

8. The plasma reactor of claim 1 further comprising an extraction voltage source coupled between said extraction electrode and said electron beam source enclosure.

9. The plasma reactor of claim 8 further comprising an acceleration voltage source coupled between said acceleration electrode and said extraction electrode.

10. The plasma reactor of claim 9 wherein said acceleration electrode is electrically coupled to a wall of said workpiece processing chamber.

11. The plasma reactor of claim 1 wherein beam opening is elongate and corresponds to a plane of an electron beam.

12. The plasma reactor of claim 11 wherein said extraction electrode, said acceleration electrode and said suppression electrode lie in respective planes transverse to said electron beam plane.

13. The plasma reactor of claim 12 wherein said respective bias sources comprise pulsed voltage sources with respective variable pulse duty cycles, said plasma reactor further comprising a controller coupled to control said respective variable pulsed duty cycles.

14. The plasma reactor of claim 1 wherein said plural segments are distributed along a direction transverse to an electron beam flow path through said beam opening.

* * * * *